(12) United States Patent
Kim et al.

(10) Patent No.: US 6,858,479 B2
(45) Date of Patent: Feb. 22, 2005

(54) LOW RESISTIVITY COPPER CONDUCTOR LINE, LIQUID CRYSTAL DISPLAY DEVICE HAVING THE SAME AND METHOD FOR FORMING THE SAME

(75) Inventors: Jae-Jeong Kim, Seoul (KR); Soo-Kil Kim, Seoul (KR); Yong-Shik Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/323,946

(22) Filed: Dec. 20, 2002

(65) Prior Publication Data

US 2003/0171003 A1 Sep. 11, 2003

(30) Foreign Application Priority Data

Mar. 7, 2002 (KR) .................................. 10-2002-0012278

(51) Int. Cl.⁷ ............................................. H01L 21/445
(52) U.S. Cl. ........................ 438/158; 438/652; 438/674; 438/686; 438/687
(58) Field of Search .................................. 438/158, 642, 438/643, 650, 652, 653, 656, 674, 685, 686, 687

(56) References Cited

U.S. PATENT DOCUMENTS

| | | | | |
|---|---|---|---|---|
| 5,788,854 A | * | 8/1998 | Desaigoudar et al. | 216/13 |
| 6,197,688 B1 | * | 3/2001 | Simpson | 438/678 |
| 6,221,765 B1 | * | 4/2001 | Ueno | 438/653 |
| 6,291,082 B1 | * | 9/2001 | Lopatin | 428/621 |
| 6,605,534 B1 | * | 8/2003 | Chung et al. | 438/674 |

* cited by examiner

Primary Examiner—Stephen W. Smoot
(74) Attorney, Agent, or Firm—Morgan Lewis & Bockius LLP (57) ABSTRACT

A method for forming a low resistively copper conductor line includes forming a silver material layer on silicon material, and forming a copper material layer on the silver material layer using an electroplating process.

11 Claims, 8 Drawing Sheets

LOW RESISTIVITY COPPER CONDUCTOR LINE, LIQUID CRYSTAL DISPLAY DEVICE HAVING THE SAME AND METHOD FOR FORMING THE SAME

The present invention claims the benefit of Korean Patent Application No. 2002-12278, filed in Korea on Mar. 7, 2002, which is hereby incorporated by reference.

BACKGROUND OF THE INVENTION

1. Field of the Invention

The present invention relates to a copper (Cu) electroplating method and more particularly, a method for forming low resistively copper (Cu) electron lines.

2. Discussion of the Related Art

In general, a copper (Cu) conductor line is used for signal lines of a liquid crystal display (LCD) device or plasma display panels (PDPS). As the size of flat panel display devices increase, electrical resistively of conductive lines used in the devices decreased. Accordingly, copper (Cu) has been commonly used as the material with which to form the conductive lines.

Figure 1:
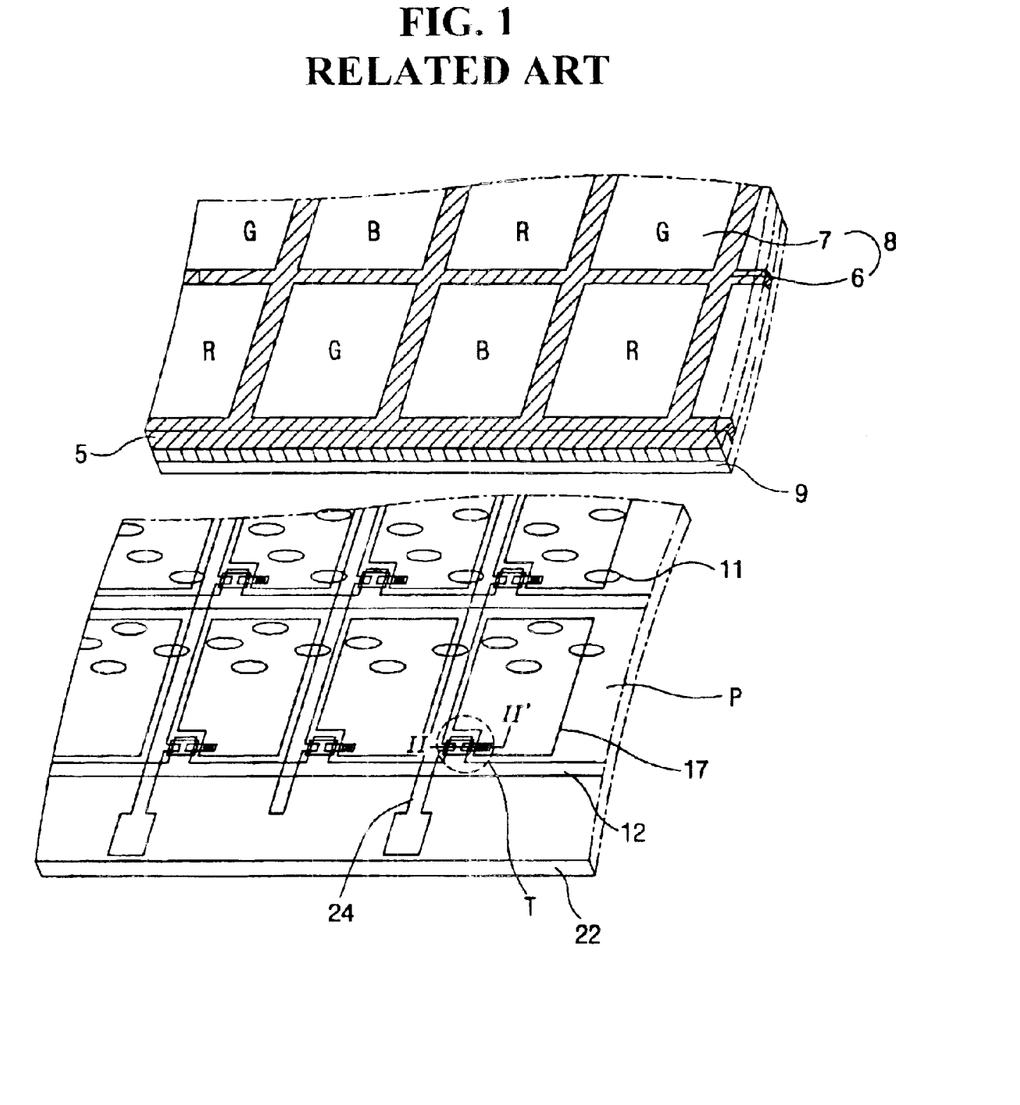
FIG. 1 is a perspective view of a liquid crystal display (LCD) device according to the related art.

FIG. 1 is a perspective view of a liquid crystal display (LCD) device according to the related art. In FIG. 1, a liquid crystal panel has upper and lower substrates 5 and 22, and liquid crystal material layer 11 interposed therebetween. The upper substrate 5 includes a color filter 8 having a black matrix 6 and sub-color filters 7, and a common electrode 9 formed on the color filter 8. The lower substrate 22 includes a pixel region "P," a pixel electrode 17 within the pixel region "P," and a plurality of gate lines 12 and a plurality of data lines 24 electrically connected to a thin film transistor "T." The lower substrate 22 is commonly referred to as an array substrate, and a plurality of thin film transistors "T" are arranged in a matrix arrangement. The pixel region "P" is defined by a crossing of the gate and data lines 12 and 24. The pixel electrode 17, which is formed within the pixel region "P," is formed of a transparent conductive material having a high transmissibility, such as indium tin oxide (ITO). The liquid crystal display (LCD) device displays images using the thin film transistor "T" and the pixel electrode 17. The gate line 12 delivers a pulse voltage for driving a gate electrode of the thin film transistor "T," and the data line 24 delivers a signal voltage for driving a source electrode of the thin film transistor "T."

The liquid crystal panel 51 is driven by electron-optical effects of liquid crystal material 11. For example, the liquid crystal material 11 has a dielectric constant anisotropy and spontaneous polarization properties. If a voltage is applied to the liquid crystal material 11, the liquid crystal molecules form a dipole due to their spontaneous polarization. Thus, an alignment direction of the liquid crystal molecules changes according to a direction of the applied voltage. Accordingly, light modulation occurs due to the change of optical properties depending on the alignment direction of the liquid crystal molecules. Images can be displayed by interrupting or transmitting light by the light modulation.

The data line 24 is commonly formed of a conductive metal material having superior thermal stability in order to prevent formation of hillocks, such as chromium (Cr), molybdenum (Mo) and tantalum (Ta). The gate and data lines 12 and 24 are commonly formed by depositing a metal material on the array substrate 22 using a physical vapor deposition method (PVD), such as a sputtering, and then by wet etching or dry etching the deposited metal material. However, while the metal materials have superior thermal stability, its high specific resistance induces a signal delay as the size of the image display device increases. Accordingly, materials that do not form the hillock and have low specific resistances have been developed.

Copper and aluminum are commonly used materials for forming conductive lines because of their low specific resistances. However, using aluminum can be problematic due to generation of hillocks. Accordingly, aluminum alloys have been developed to overcome hillock generation, but the aluminum alloys have high specific resistances. However, copper requires additional processes for forming a diffusion barrier since copper easily diffuses into silicon, such as silicon oxide ($SiO_2$) and silicon substrates. In addition, the diffusion barrier increases the specific resistance of copper because of its own high specific resistance overshadows any advantage that copper offers as the material for conductive lines.

SUMMARY OF THE INVENTION

Accordingly, the present invention is directed to a low resistively copper conductor line, liquid crystal display device having the same, and method for forming the same that substantially obviates one or more of problems due to limitations and disadvantages of the related art.

An object of the present invention is to provide a copper conductor line that has a low resistively.

Another object of the present invention is to provide a liquid crystal display device having a low resistively copper conductor line.

Another object of the present invention is to provide a method for forming a copper conductor line having a low resistively.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for forming a low resistively copper conductor line includes forming a silver material layer on silicon material, and forming a copper material layer on the silver material layer using an electroplating process.

In another aspect, a method for forming a low resistively copper conductive line for a liquid crystal display (LCD) device includes forming a silicon layer on a substrate, forming a silver layer on the silicon layer using a deposition process, patterning the silver layer into a first shape, and forming a copper layer on the silver layer by an electroplating process using the silver layer as a seed layer.

In another aspect, a method for forming a low resistively copper conductive line for a semiconductor element includes forming a silver thin film on a silicon layer by depositing silver on the silicon layer, patterning the silver thin film into a first shape, and forming a copper thin film on the silver thin film by an electroplating process using the silver thin film as a seed layer.

In another aspect, a method for fabricating an array substrate of a liquid crystal display device includes forming a first silver thin film by depositing and patterning silver on a substrate, forming a copper thin film on the first silver thin film by an electroplating process using the first silver thin film as a seed layer to form a gate line and gate electrode, forming a gate insulating layer on an entire surface of the substrate, forming an active layer and an ohmic contact layer sequentially on the gate insulating layer, forming a second silver thin film by depositing and patterning silver on the substrate, forming a copper thin film on the second silver thin film by an electroplating process using the second silver thin film as a seed layer to form a data line, and source and drain electrodes, forming a passivation layer an entire surface of the substrate, patterning the passivation layer to expose a portion of the drain electrode, and forming a pixel electrode on the passivation layer to electrically contact the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the illustrated embodiment of the present invention, which is illustrated in the accompanying drawings.

One of the many characteristics of the present invention is to form a silver (Ag) thin film under a copper conductive line. More specifically, the silver thin film may be formed on a silicon oxide ($SiO_2$) material by a physical vapor deposition (PVD) method, for example, to a thickness of about 50 nm. Then, copper may be plated on the silver thin film by an electroplating process, for example. After the silver thin film is formed on the silicon oxide ($SiO_2$) material, the deposited silver thin film is dipped into silver nitrate ($AgNO_3$), which is diluted with a ratio of 1:7000, for about one minute to remove any organic materials and sulfides on the deposited silver thin film prior to performing the copper electroplating process. The copper electroplating process may be performed in an electrolyte containing copper sulfate ($CuSO_4$) of about 1 M (molarity), sulfuric acid ($H_2SO_4$) of about 0.05 M (molarity) and water ($H_2O$) at about −400 mV on a saturated calomel electrode base. A thickness of the plated copper thin film may be about 100 nm. A diffusion barrier may further be formed on the silicon oxide ($SiO_2$) material to include materials such as titanium nitride (TiN) before formation of the silver thin film.

Figure 2A:
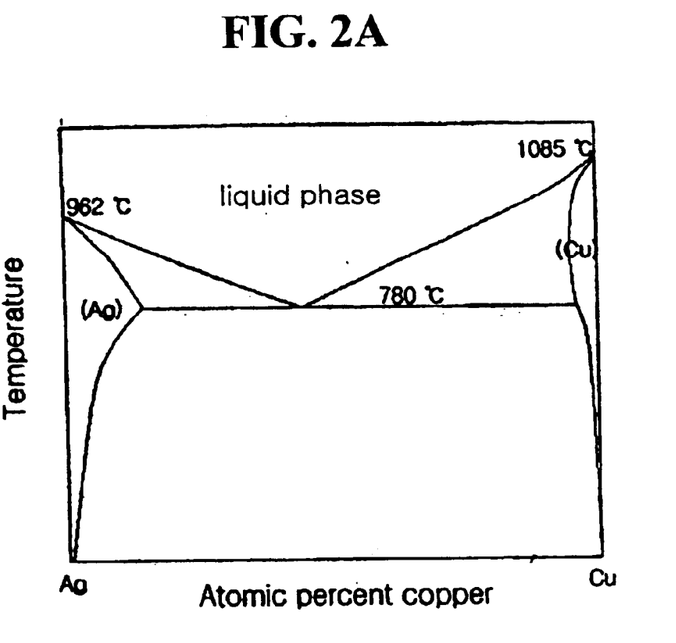
FIGS. 2A and 2B are exemplary phase diagrams of Ag/Cub and Ag/Si, respectively, according to the present invention.
Figure 2B:
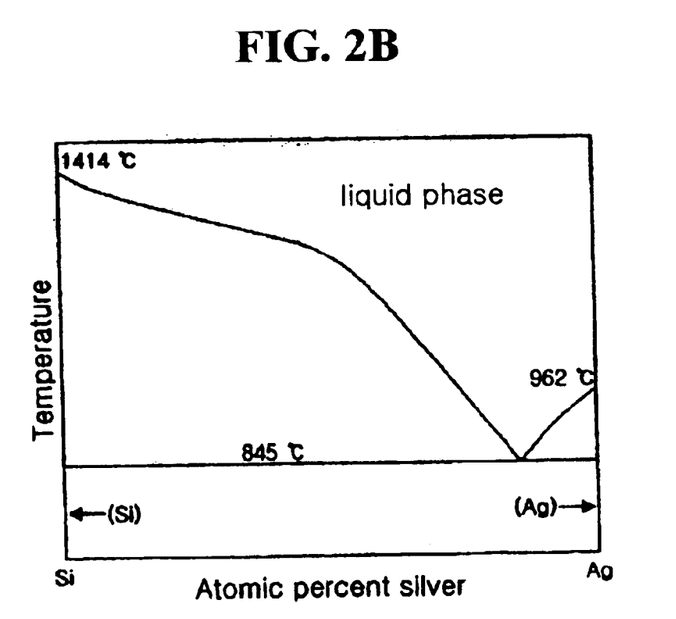

FIGS. 2A and 2B are exemplary phase diagrams of Ag/Cu and Ag/Si, respectively, according to the present invention. FIGS. 2A to 2B examine the reactivity of the silver/copper and the reactivity of the silver/silicon during heat treatment at a relatively high temperature of about 300° C. In FIGS. 2A and 2B, the silver/copper and the silver/silicon keep stable states without any interactions between themselves.

Figure 3:
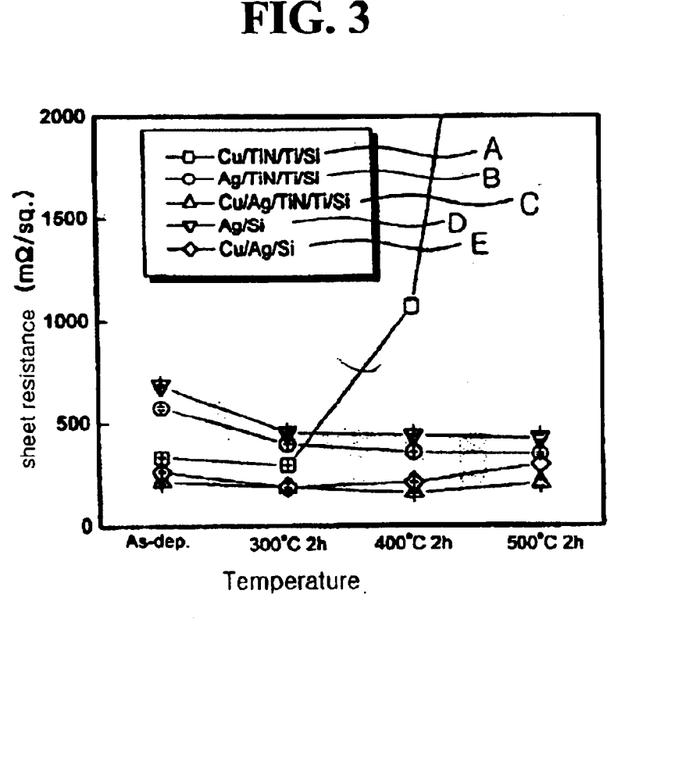
FIG. 3 is a graph showing exemplary changes of sheet resistance of test samples in relation to an increase of temperature according to the present invention.

FIG. 3 is a graph showing exemplary changes of sheet resistance of test samples in relation to an increase of temperature according to the present invention. In FIG. 3, "A" represents Cu/TiN/Ti/Si in which titanium (Ti) is formed on silicon (Si) material, titanium nitride (TiN) on the titanium (Ti), and copper (Cub) on the titanium nitride (TiN) in a sequence. In addition, "B" represents Ag/TiN/Ti/Si in which titanium (Ti) is formed on the silicon (Si) material, the titanium nitride (TiN) on the titanium (Ti), and the silver (Ag) on the titanium nitride (TiN) in a sequence. In addition, "C" presents Cu/Ag/TiN/Ti/Si in which the titanium (Ti) is formed on the silicon (Si) material, the titanium nitride (TiN) on the titanium (Ti), the silver (Ag) on the titanium nitride (TiN), and the copper (Cu) on the silver (Ag) in a sequence. In addition, "D" presents Ag/Si in which only the silver (Ag) is formed on the silicon (Si) material, and "E" represents Cu/Ag/Si in which the silver (Ag) is formed on the silicon (Si) material and the copper (Cu) is formed on the silver (Ag) in a sequence.

In the case of "A," in which a conventional diffusion barrier of the titanium nitride (TiN) thin film is formed under the copper with the silver thin film formed under the copper, the sheet resistance rapidly increases after a heat treatment for two hours at a temperature of about 400° C. This inclination becomes much more conspicuous after the heat treatment for two hours at a temperature of about 500° C. because the copper diffuses into the silicon material through the diffusion barrier, and then forms a silicon compound ($Cu_4Si$). However, in the case of "C," in which the silver thin film is formed on the diffusion barrier of the titanium nitride (TiN) to a thickness of about 50 nm, and then the copper electroplating process is performed on the silver thin film, the sample maintains a stable state without a noticeable change of sheet resistance until about 500° C. of the heat treatment. This inclination can also be observed in the case of "E," in which the silver thin film is formed directly on the silicon material without a diffusion barrier, and then the copper electroplating process is performed on the silver thin film. Accordingly, the silver thin film does not just serve to increase an efficiency of the diffusion barrier, but serves as the diffusion barrier.

Figure 4A:
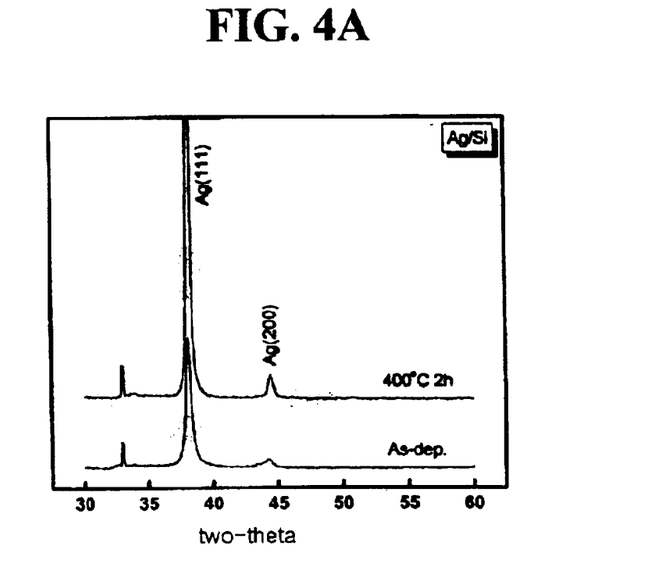
FIGS. 4A, 4B, and 4C are exemplary X-ray diffraction analysis graphs of test samples before and after heat treatment according to the present invention.
Figure 4B:
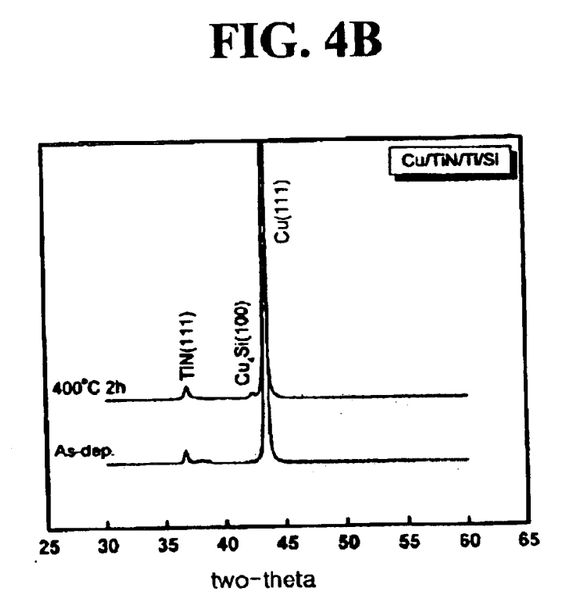
Figure 4C:
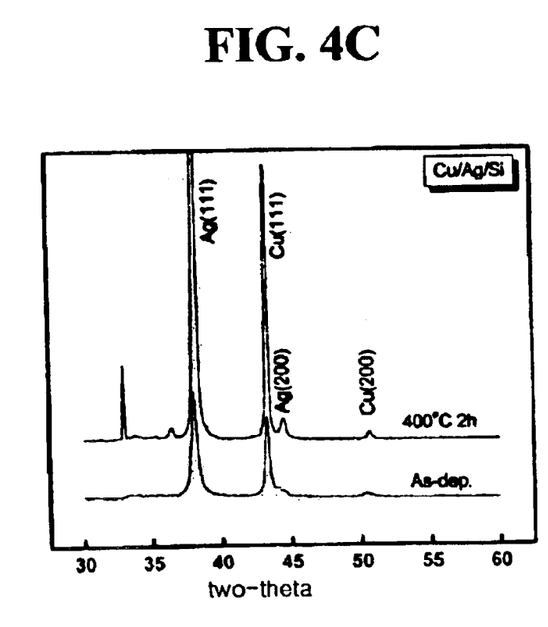

FIGS. 4A, 4B, and 4C are exemplary X-ray diffraction analysis graphs of test samples before and after heat treatment according to the present invention, wherein the heat treatment lasts for two hours at a temperature of about 400° C. In FIG. 4A, a test piece has a layered structure in a sequence of silver (Ag)/silicon (Si), in FIG. 4B a test piece has a layered structure in a sequence of copper (Cu)/titanium nitride (TiN)/titanium (Ti)/silicon (Si), and in FIG. 4C a test piece has a layered structure in a sequence of copper (Cu)/silver (Ag)/silicon (Si).

In the FIG. 4A, the silver thin film does not react with the silicon material even after the heat treatment at a temperature of about 400° C. because an orientation of a crystal is produced by a reaction of the silicon and the silver. However it can be observed from FIG. 4B that the copper thin film maintains a stable state without reacting with the silicon material right after being deposited onto the diffusion barrier of the titanium nitride (TiN). However, the copper thin film forms a copper-silicon compound ($Cu_4Si$) after the heat treatment for two hours at a temperature of about 400° C. On the other hand, the copper thin film maintains a stable state without reacting with the silicon before and after the heat treatment for two hours at a temperature of about 400° C., as shown in the FIG. 4C. Thus, the silver thin film serves as an effective diffusion barrier for the copper thin film as well as a seed layer for the copper electroplating process. Accordingly, if the silver thin film is used as the seed layer for the copper electroplating process, the diffusion barrier for the copper thin film may not be necessary.

Figure 5:
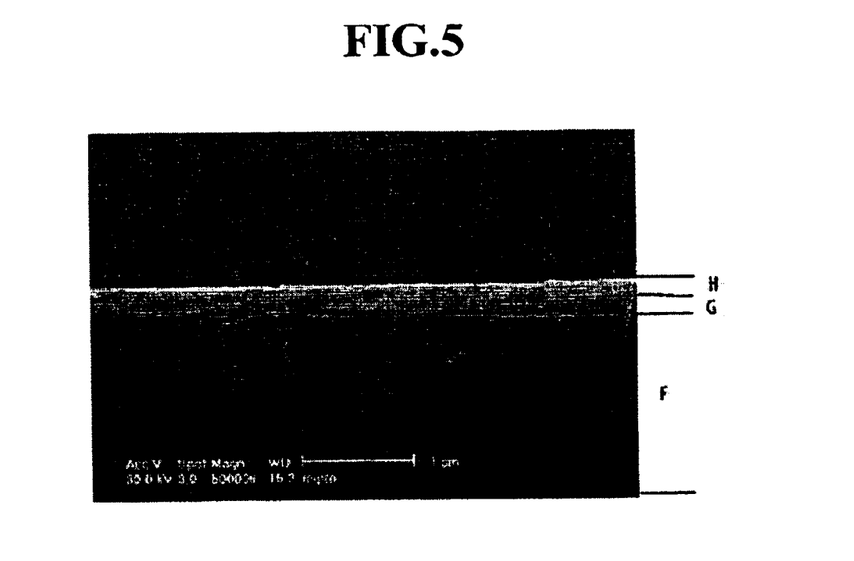
FIG. 5 is a field emission scanning electron microscopic (FESEM) photomicrograph of a cross section of an exemplary Cub/Ag/Si thin film according to the present invention.
Figure 6:
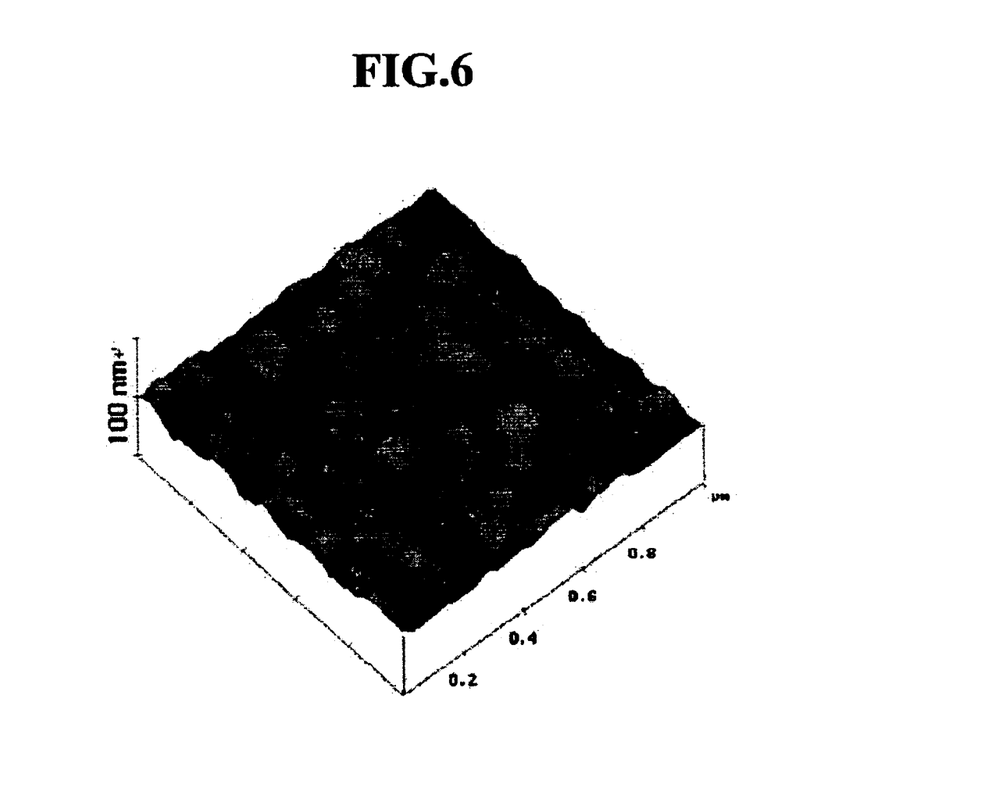
FIG. 6 is an atomic force microscopic (AFM) photomicrograph of a surface roughness of the exemplary Cu/Ag/Si thin film of FIG. 5 according to the present invention.

FIG. 5 is a field emission scanning electron microscopic (FESEM) photomicrograph of a cross section of an exemplary Cu/Ag/Si thin film according to the present invention, and FIG. 6 is an atomic force microscopic (AFM) photomicrograph of a surface roughness of the exemplary Cu/Ag/Si thin film of FIG. 5 according to the present invention. In FIG. 5, the field emission scanning electron microscopic (FESEM) photomicrograph shows the cross section of copper (Cu)/silver (Ag)/silicon (Si) thin film when the copper electroplating process is performed for about 400 seconds after the silver thin film is formed on the silicon material. As shown in FIG. 5, the copper thin film "H" does not diffuse into the silicon material "F" through the silver thin film "G." The specific resistance of the copper film that is formed on the silver thin film is about 2.93 $\mu\Omega\cdot cm$ and about 3.27 $\mu\Omega\cdot cm$, which is equivalent to the specific resistance of the copper film having a same thickness and formed using a seed layer of copper in the copper electroplating process. In FIG. 6, surface roughness of the copper thin film that is formed on the silver thin film is about 5.7 nm in a root-mean-square (rms) value and this value is also equivalent to surface roughness of the copper thin film that has a same thickness and formed using a seed layer of copper in the copper electroplating process. Accordingly, the copper thin film that is formed on the silver thin film by the copper electroplating process using the silver thin film as the seed layer shows a stable property until about 500° C. of the heat treatment without the diffusion barrier under the copper thin film, and a property of the plated copper thin film is satisfactory.

A method for forming the copper thin film according to the present invention may be applied to conductive lines for many image display devices and semiconductor elements. For example, the present invention may be applied to metal lines of gate electrodes, capacitors, source and drain electrodes, and first and second metal line layers. In a case of the gate electrode, a conductive line for the gate electrode can be manufactured according to the present invention. More specifically, the silver film may be formed on a silicon substrate, and then the copper film may be formed on the silver film by the copper electroplating process. In addition, a diffusion barrier of titanium nitride (TiN) may further be formed between the copper film and the silver film.

Figure 7:
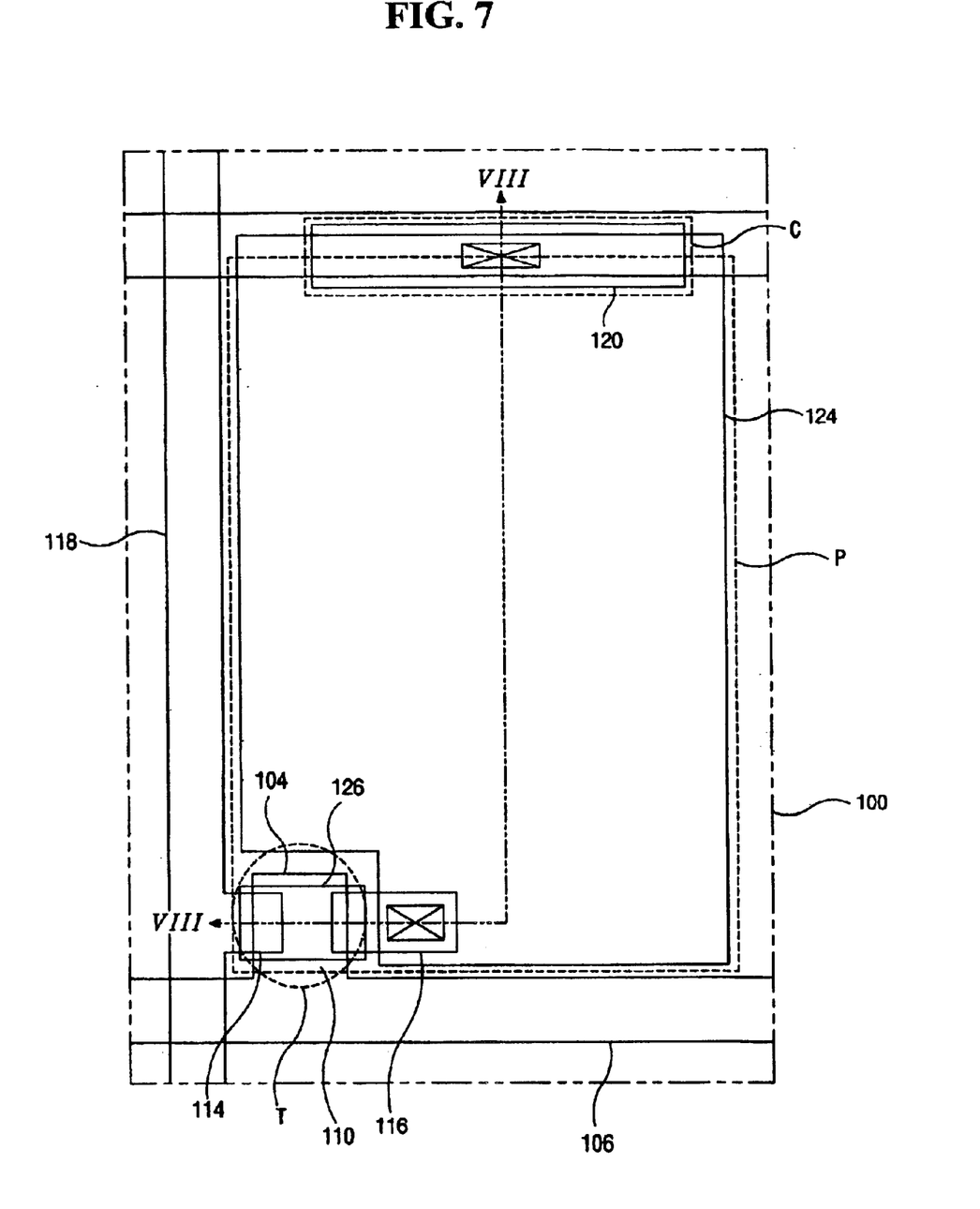
FIG. 7 is a partial plan view of an exemplary array substrate for a liquid crystal display (LCD) device according to the present invention.

FIG. 7 is a partial plan view of an exemplary array substrate for a liquid crystal display (LCD) device according to the present invention. In FIG. 7, a gate line 106 and a data line 118 may define a pixel region "P" by crossing each other on a substrate 100. A thin film transistor "T" may be formed at the cross point of the gate and data lines 106 and 118, and may include a gate electrode 104, a source electrode 114, and a drain electrode 116. The gate electrode 104 may be electrically connected to the gate line 106, and a scan signal may be applied to the gate electrode 104 through the gate line 106. The source electrode 114 may be electrically connected to the data line 118, and a data signal may be applied to the source electrode 114 through the data line 118. An active layer 110 may be formed over the gate electrode 104 to contact the source and drain electrodes 114 and 116, and an island shaped metal pattern 120 may be formed over the gate line 106. A transparent pixel electrode 124 may be formed within the pixel region "P" to electrically contact the drain electrode 116, and the pixel electrode 124 may be formed to extend to a top portion of the gate line 106 to electrically contact the metal pattern 120. A portion of the gate line 106 may function as a first capacitor electrode, and the metal pattern 120 that contacts the pixel electrode 124 may function as a second capacitor electrode. A gate insulating layer (not shown) may be formed between the first and second capacitor electrodes to function as a capacitor dielectric. Accordingly, the portion of the gate line 106, the metal pattern 120, and the gate insulating layer (not shown) may form a storage capacitor "C." Among elements of abovementioned array substrate the gate line 106, the data line 118, the gate electrode 104, and the source and drain electrodes 114 and 116 may be formed by the copper electroplating process according to the present invention.

Figure 8A:
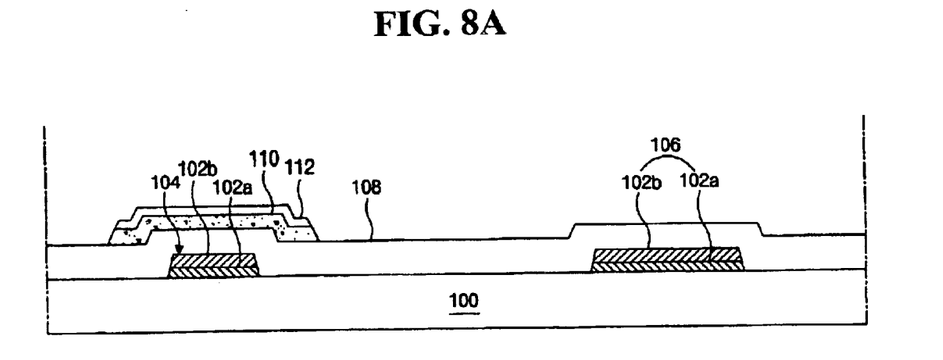
FIGS. 8A, 8B, and 8C are cross sectional views along VIII—VIII of FIG. 7 showing an exemplary fabricating sequence of an array substrate for a liquid crystal display (LCD) device according to the present invention.
Figure 8B:
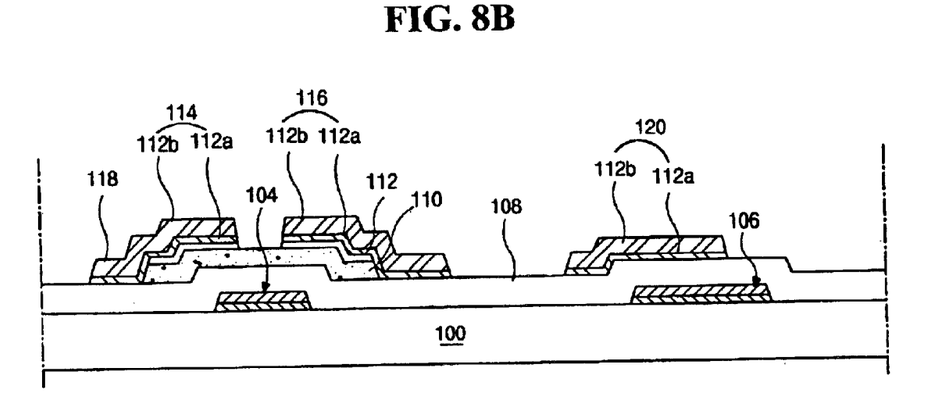
Figure 8C:
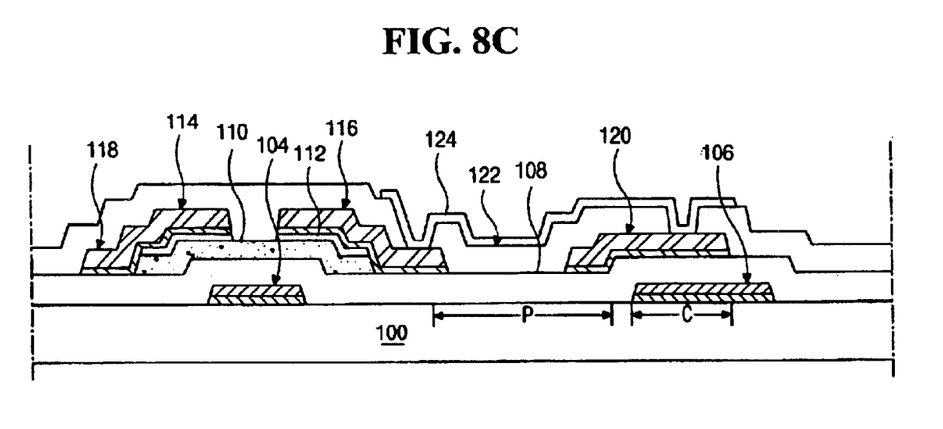

FIGS. 8A, 8B, and 8C are cross sectional views along VIII—VIII of FIG. 7 showing an exemplary fabricating sequence of an array substrate for a liquid crystal display (LCD) device according to the present invention. In FIG. 8A, a silver thin film may be formed on a transparent substrate 100 by a physical vapor deposition (PVD) method, for example, to a thickness of about 50 nm. Then, the deposited silver thin film may be patterned into a shape of a gate electrode 104 and a gate line 106. Formation of the gate electrode 104 and the gate line 106 may be completed by forming a copper thin film 102b on a silver thin film 102a by a copper electroplating process according to the present invention. The silver thin film may be used as a seed layer in the copper electroplating process. A gate insulating layer 108 may be formed by depositing an inorganic insulating material, such as silicon nitride (SiNx) and silicon oxide ($SiO_2$), on the entire surface of the transparent substrate 100. An active layer 110 and an ohmic contact layer 112 may be sequentially formed over the gate electrode 104 by depositing amorphous silicon (a–Si:H) and impurity-doped amorphous silicon (n+a-Si:H), and then pattering them.

In FIG. 8B, a silver thin film may be formed on the transparent substrate 100 by a physical vapor deposition (PVD) method, for example, to a thickness of about 50 nm, and then the deposited silver thin film may be patterned to a shape of the data line 118, the source electrode 114, the drain electrodes 116, and the metal pattern 120. The data line 118, the source electrode 114, the drain electrode 116, and the metal pattern 120 may be formed by forming a copper thin film 112b on a silver thin film 112a by a copper electroplating process using the silver thin film as a seed layer.

In FIG. 8C, a passivation layer 122 may be formed by depositing an organic insulating material, such as benzocyclobutene (BCB) and acrylic resin, on an entire surface of the transparent substrate 100. The passivation layer 122 may be subsequently patterned to expose a portion of the drain electrode 116 and a portion of the metal pattern 120. The pixel electrode 124 that contacts the drain electrode 116 and the metal pattern 120 through the passivation layer 124 may be formed by depositing transparent conductive material, such as indium tin oxide (ITO) and indium zinc oxide (IZO), on the passivation layer 124, and then patterning it.

The array substrate of the liquid crystal display (LCD) device having copper conductive lines may be manufactured using the above process. Thus, if the silver thin film is formed under the copper thin film is to be used as seed layer before the copper electroplating process, the plated copper thin film exhibits a stable property even after the heat treatment, and the copper does not diffuse into silicon. As a result, an additional diffusion barrier for preventing the copper from diffusing into the silicon may be necessary. Accordingly, the specific resistance of the copper is relatively high because of the diffusion barrier, but may be significantly lowered. In addition, large-sized image display devices having high resolution may be obtained by applying the low resistively copper conductor line to the image display devices.

It will be apparent to those skilled in the art that various modifications and variations can be made in the low resistively copper conductor line, liquid crystal display device having the same and method for forming the same of the present invention without departing from the spirit or scope of the invention. Thus, it is intended that the present invention cover the modifications and variations of this invention provided they come within the scope of the appended claims and their equivalents.

What is claimed is:

1. A method for forming a low resistively copper conductor line, comprising:

forming a silver material layer directly on silicon material;

etching the silver material layer; and forming a copper material layer on the etched silver material layer using an electroplating process.

2. A method for forming a low resistively copper conductive line for a liquid crystal display (LCD) device, comprising:

forming a silicon layer on a substrate;

forming a silver layer on the silicon layer using a deposition process;

patterning the silver layer into a first shape; and forming a copper layer on the silver layer by an electroplating process using the silver layer as a seed layer.

3. The method according to claim 2, wherein a thickness of the silver layer is about 50 nm.

4. The method according to claim 2, wherein a specific resistance of the copper conductive line is between about 2.93 $\mu\Omega$·cm and about 3.27 $\mu\Omega$·cm.

5. A method for forming a low resistively copper conductive line for a semiconductor element, comprising:

forming a silver thin film directly on a silicon layer by depositing silver directly on the silicon layer;

patterning the silver thin film into a first shape; and forming a copper thin film on the silver thin film by an electroplating process using the silver thin film as a seed layer.

6. The method according to claim 5, wherein a thickness of the silver thin film is about 50 nm.

7. The method according to claim 5, wherein a specific resistance of the copper conductive line is between about 2.93 $\mu\Omega$·cm and about 3.27 $\mu\Omega$·cm.

8. A method for fabricating an array substrate of a liquid crystal display device, comprising:

forming a first silver thin film by depositing and patterning silver on a substrate;

forming a copper thin film on the first silver thin film by an electroplating process using the first silver thin film as a seed layer to form a gate line and gate electrode;

forming a gate insulating layer on an entire surface of the substrate;

forming an active layer and an ohmic contact layer sequentially on the gate insulating layer;

forming a second silver thin film by depositing and patterning silver on the substrate;

forming a copper thin film on the second silver thin film by an electroplating process using the second silver thin film as a seed layer to form a data line, and source and drain electrodes;

forming a passivation layer on an entire surface of the substrate;

patterning the passivation layer to expose a portion of the drain electrode; and forming a pixel electrode on the passivation layer to electrically contact the drain electrode.

9. The method according to claim 8, wherein a thickness of both the first and second silver thin films is about 50 nm.

10. The method according to claim 8, wherein specific resistances of both the gate line and the data line are between about 2.93 $\mu\Omega$·cm and about 3.27 $\mu\Omega$·cm.

11. The method according to claim 8, further comprising a step of forming a metal pattern over the gate line that electrically contacts the pixel electrode.

* * * * *